United States Patent
Tsironis

(10) Patent No.: US 12,111,347 B1
(45) Date of Patent: Oct. 8, 2024

(54) SIMPLE WAVEGUIDE LOAD PULL TUNER

(71) Applicant: Christos Tsironis, St-Laurent (CA)

(72) Inventor: Christos Tsironis, Kirkland (CA)

( * ) Notice: Subject to any disclaimer, the term of this patent is extended or adjusted under 35 U.S.C. 154(b) by 146 days.

(21) Appl. No.: 17/975,885

(22) Filed: Oct. 28, 2022

(51) Int. Cl.
| | |
|---|---|
| *G01R 31/28* | (2006.01) |
| *G01R 1/067* | (2006.01) |
| *G01R 1/073* | (2006.01) |
| *G01R 27/00* | (2006.01) |
| *G01R 27/04* | (2006.01) |
| *G01R 31/26* | (2020.01) |
| *H01P 5/04* | (2006.01) |

(52) U.S. Cl.
CPC ..... *G01R 31/2822* (2013.01); *G01R 1/06772* (2013.01); *H01P 5/04* (2013.01)

(58) Field of Classification Search
CPC ........ G01R 31/02; G01R 31/26; G01R 31/28; G01R 31/2822; G01R 27/00; G01R 27/04; G01R 1/02; G01R 1/04; G01R 1/067; G01R 1/073; G01R 35/00
See application file for complete search history.

(56) References Cited

U.S. PATENT DOCUMENTS

| | | |
|---|---|---|
| 5,910,754 A | 6/1999 | Simpson et al. |
| 9,625,556 B1 | 4/2017 | Tsironis |
| 10,451,702 B1 * | 10/2019 | Tsironis .............. F02D 13/0226 |
| 11,095,013 B1 | 8/2021 | Tsironis |

OTHER PUBLICATIONS

"Load Pull Measurements" [online], Wikipedia [retrieved on Nov. 18, 2016] Retrieved from Internet <URL:http://en.wikipedia.org/wiki/Load_pull>.
"Computer Controlled Microwave Tuner", Product Note 41, Focus Microwaves, Jan. 1998.
"Automatic Load Contour Mapping for Microwave Power Transistors" IEEE transactions on MTT, vol. 22, No. 12, Dec. 1974, pp. 1146-1152.
"Two-port Gain and Stability", Niknejad, University of California, Berkley, p. 15 of 32.
"Linear Actuator"[online], Wikipedia [retrieved on Apr. 25, 2020] Retrieved from Internet <URL: https://en.wikipedia.org/wiki/Linear_actuator>.
"A Computer-Controlled Microwave Tuner for Automated Load Pull", Sechi F, et al., RCA Review, vol. 44, Dec. 1983, pp. 566-583, figure 5.
"Lecture 20: Transmission (ABCD) Matrix" [online], EE 481/581—Microwave Engineering, Course Syllabus [retrieved on Jul. 13, 2015] Retrieved from Internet <URL: http://whites.sdsmt.edu/classes/ee481/notes/481Lecture20>.
"What is a Vector Network Analyzer and how does it work?" [online], Tektronix [retrieved on Jun. 10, 2020] Retrieved from Internet < https://www.tek.com/document/primer/what-vector-network-analyzer-and-how-does-it-work>.

* cited by examiner

*Primary Examiner* — Neel D Shah

(57) ABSTRACT

A simple low-profile waveguide load pull tuner uses a horizontally only moving reflective probe and an adjustable attenuator placed between the DUT and the tuning probe. Both controls are using stepper attenuators mounted on the waveguide. This simplifies the design and minimizes the cost of manufacturing. The tuner has wideband 50 Ohm tuning capability allowing minimum risk of transient spurious oscillations. A de-embedding adapter removal calibration method allows generating thousands of calibrated points in a small fraction of the time needed for calibration of the full permutations.

7 Claims, 10 Drawing Sheets

FIG. 9A
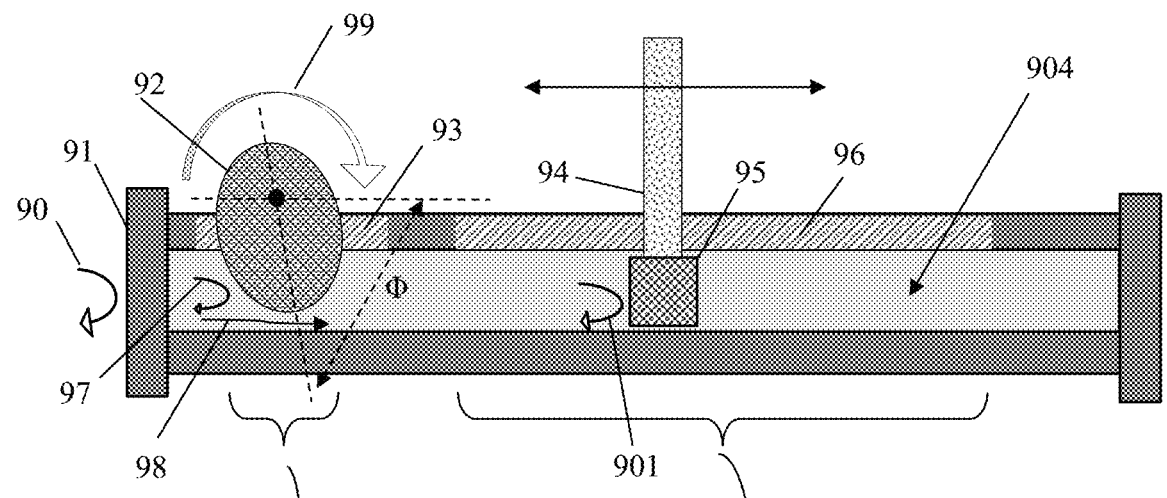
FIG. 9B
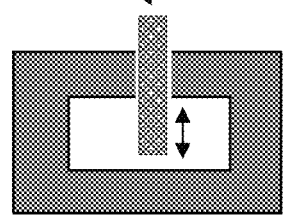
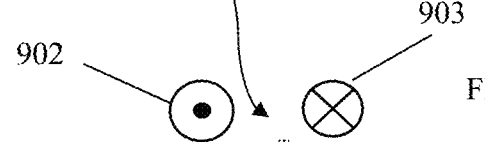
FIG. 9C
FIG. 9

SIMPLE WAVEGUIDE LOAD PULL TUNER

PRIORITY CLAIM

Not Applicable

CROSS-REFERENCE TO RELATED ARTICLES

1. "Load Pull Measurements" [online], Wikipedia [retrieved on Nov. 18, 2016] Retrieved from Internet <URL:http://en.wikipedia.org/wiki/Load_pull>.
2. "Computer Controlled Microwave Tuner—CCMT", Product Note 41, Focus Microwaves January 1998.
3. Simpson et al. U.S. Pat. No. 5,910,754, "Reduced Height Waveguide Tuner for Impedance Matching", FIG. 8.
4. "Automatic Load Contour Mapping for Microwave Power Transistors" IEEE transactions on MTT, Vol.-22, No 12, December 1974, pp. 1146-1152.
5. Tsironis C., U.S. Pat. No. 11,095,013 "Integrated terahertz slide screw tuner".
6. Tsironis C., U.S. Pat. No. 9,625,556, "Method for Calibration and Tuning with Impedance Tuners".
7. "Two-port Gain and Stability", Niknejad, University of California, Berkley, page 15 of 32.
8. Linear Actuator [online], Wikipedia [retrieved on Apr. 25, 2020] Retrieved from Internet <URL: https://en.wikipedia.org/wiki/Linear_actuator>
9. "A Computer-Controlled Microwave Tuner for Automated Load Pull", Sechi F, et al., RCA Review, Vol 44, December 1983, pp. 566-583, FIG. 5.
10. "Lecture 20: Transmission (ABCD) Matrix" [online], EE 481/581—Microwave Engineering, Course Syllabus [retrieved on Jul. 13, 2015] Retrieved from Internet <URL: http://whites.sdsmt.edu/classes/ee481/notes/481Lecture20>
11. "What is a Vector Network Analyzer and how does it work?" [online], Tektronix [retrieved on Jun. 10, 2020] Retrieved from Internet <https://www.tek.com/document/primer/what-vector-network-analyzer-and-how-does-it-work>.

BACKGROUND OF THE INVENTION

This invention relates to RF load and source pull testing of medium and high-power RF transistors and amplifiers using remote controlled electro-mechanical impedance tuners.

A popular method for testing and characterizing such microwave components (transistors) in the non-linear region of operation is "load pull" (see ref. 1). Load pull is a RF device measurement technique employing microwave impedance tuners and other microwave test equipment as shown in FIG. 1. The microwave tuners 2, 4 (see ref. 2) are used in order to manipulate the microwave impedance conditions under which the Device Under Test (DUT, or transistor, 3) is tested; the test signal is provided by a signal source 1 and the out-coming power is measured by a power meter 5; the whole is controlled by a PC controller 6, which comprises electronic interface to communicate with the instruments 1, 5 and the tuners 2, 4 using digital control and communication cables 7, 8 and 9.

DESCRIPTION OF PRIOR ART

Impedance tuners use, in most cases, the slide screw concept: they include a slotted low loss transmission air line 30 between a test (input) port 34 and an output (idle) port 36, which can be coaxial (slabline) or waveguide, FIG. 3, and a number of conductive tuning elements (tuning probes, 31 in FIGS. 3 and 21 in FIG. 2); the probe 21 is attached using a handle 22 on complex adjustable high precision vertical axes 33 (see ref. 3), controlled by stepper motors 32, and are inserted 26 into the air line 24, approaching very closely a center conductor 23 and moved 25 along the axis of the airline, creating this way the signal reflection 35; in case of a waveguide the simple penetration of the conductive tuning probe has a similar effect. This movement of the tuning probes creates a controllable variable reactance, allowing the synthesis of various impedances Z (or reflection factors Γ) covering large parts, up to the quasi totality, of the Smith chart (the polar impedance mapping display showing the normalized reflection factor area). The relation between reflection factor δ and impedance Z is given by $\Gamma=(Z-Z_0)/(Z+Z_0)$, where $Z=R+jX$ and $Z_0$ is the characteristic impedance. A typical value used for $Z_0$ is 50Ω.

In the case of coaxial tuners parallelepiped metallic tuning probes (slugs) 21, FIG. 2, must be positioned within micrometers from the center conductor to create acceptable high reflection (high tuning range); this creates electrical sparking risk at high power. Also, it creates extreme demand on the precision of the vertical axis mechanism. In waveguide tuners the situation is similar, whereby the highly precise vertical movement of the tuning probe requires extremely complex and cumbersome vertical axis arrangements (see ref. 3). These two shortcomings can be partly countered when using dual probe tuners in a coaxial environment, as first proposed by Cusack (see ref. 4); we say "partly", because while there is no need for a vertical axis, at the same time such tuners do not allow for a wideband low reflection state and, no prior art regarding such tuners teaches a generic wideband calibration method (see ref. 6) or an alternative design providing wideband nearly 50Ω neutral state (see ref. 4, FIG. 6a).

BRIEF SUMMARY OF THE INVENTION

The invention claims a load pull tuner system using a new tuner type. The structure is different from prior art slide screw single- and two-probe tuners (ref. 2, 4 and 9), because it uses horizontal-only high-speed tuning probe movement (as ref. 4 and 9) but, in addition it uses a) a pre-inserted adjustable attenuator to mitigate the disadvantageous residual spurious reflection of the tuner in ref. 4 and 9, and b) a new fast de-embedding calibration method, which in ref. 9 was substituted by an inaccurate numerical model. Once the tuner is properly calibrated, prior art impedance synthesis (tuning) methods are applicable (see ref. 6).

The tuner itself uses a slotted, low loss, waveguide airline, (FIG. 5), in order to allow simple manufacturing and alignment for high power tuning. The main manufacturing difficulty of traditional slide screw tuners, as shown in FIG. 3, is the requirement for high resolution and high accuracy vertical axes. It is common knowledge in mechanical engineering that high resolution and high accuracy gear, such as a micro-metric screw drive, requires long travel allowing for the imperfections of the helicoidal thread to self-compensate for backlash; this, long travel applied in the vertical axes of traditional slide screw tuners makes the tuners tall, cumbersome (FIG. 3) and incompatible with on-wafer integration (see ref. 5, FIGS. 7, 8 and 12).

The tuner presented here (FIG. 9) includes one, horizontally only moving, tuning probe 95 and a variable attenuator 92; the variable attenuator (FIG. 4) is made of an eccentrically into a slot 47, 93 in the waveguide 45, 904 rotating 43, 99 circular or oval RF energy absorbing sliver 44, 92 attached either directly 42 or via a reducing gear with a remotely controlled stepper motor 41, which controls accurately the penetration 46 of the absorbing sliver into the waveguide and by that the attenuation (FIG. 6) between 0 dB (sliver withdrawn, thru line) and full signal stoppage (sliver fully inserted, 30 dB attenuation). This attenuation modifies the amplitude of the reflection factor 901 when it arrives 90 at the test port 91, by creating a set of circles as depicted in FIG. 10, showing that any point of the Smith chart can be reached by a combination of attenuation level (controlled by angle Φ) and tuning probe position (X); or, by controlling the amplitude and the phase of the reflection factor we can synthesize any impedance on the Smith chart, within the tuning range.

BRIEF DESCRIPTION OF THE SEVERAL VIEWS OF THE DRAWINGS

The invention and its mode of operation will be more clearly understood from the following detailed description when read with the appended drawings in which:

FIG. 6A depicts the transmission and FIG. 6B depicts the reflection.

FIGS. 9A through 9C depict a cross section of the tuner; FIG. 9A depicts the overall tuner, FIG. 9B depicts the attenuator section and FIG. 9C depicts the fixed penetration tuning probe section.

DETAILED DESCRIPTION OF THE INVENTION

Figure 1:
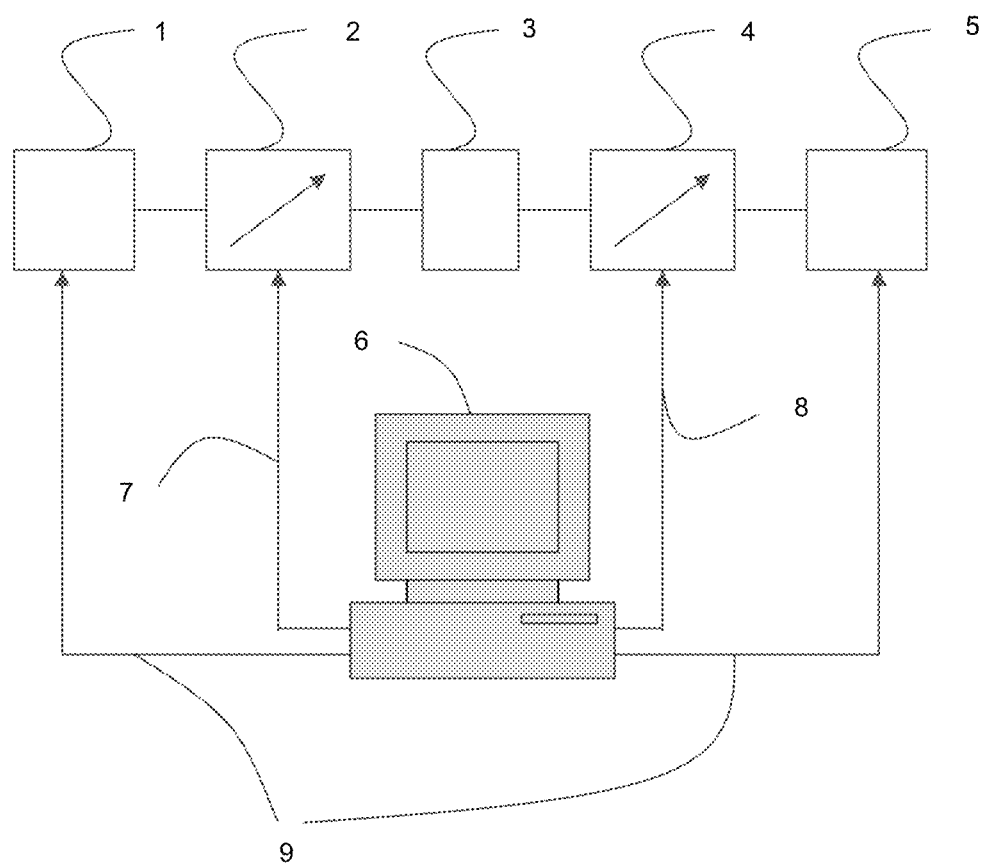
FIG. 1 depicts prior art: a typical automated load pull test system.
Figure 2:
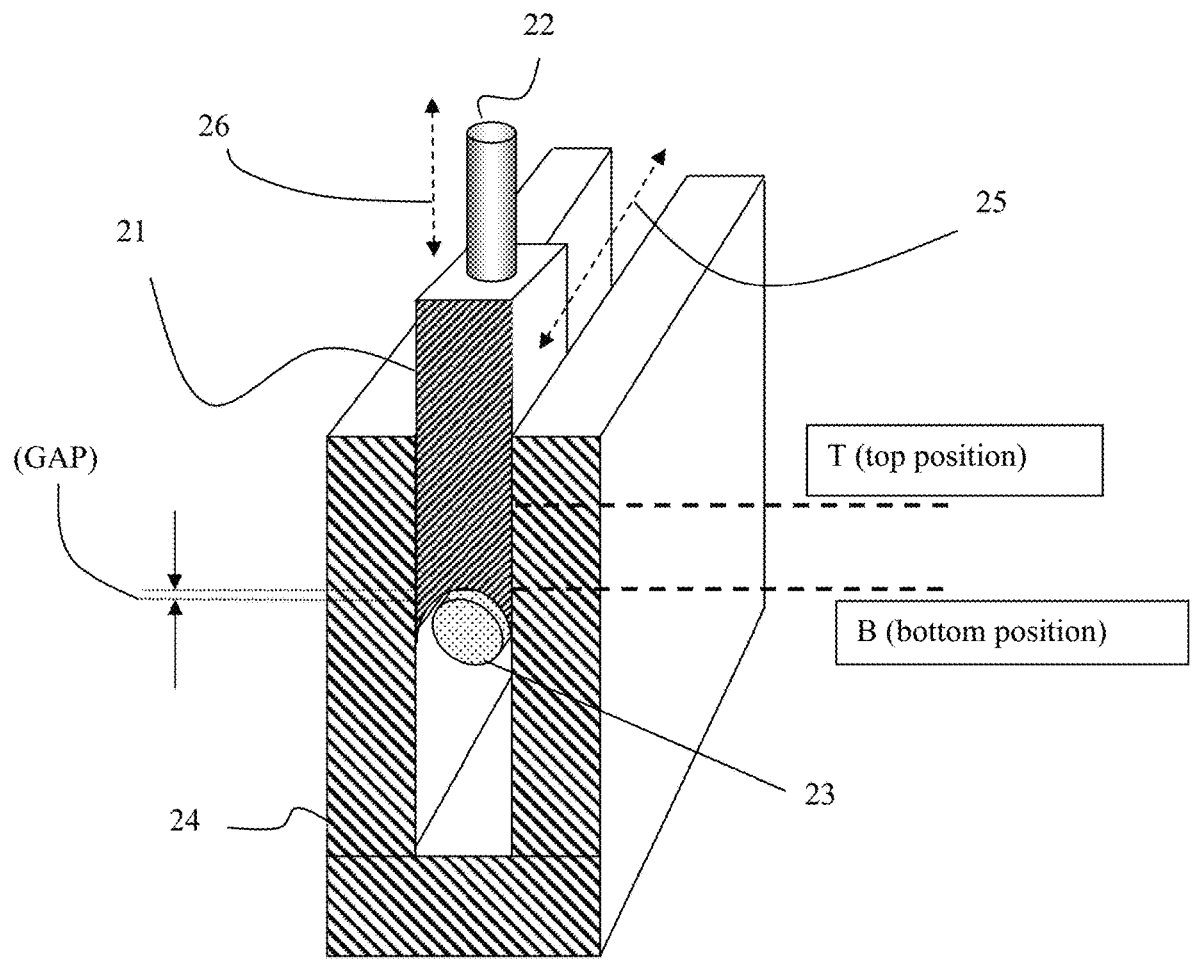
FIG. 2 depicts prior art: a perspective view of a capacitively coupled, vertically adjustable RF parallelepiped tuning probe (slug) and the relevant dimensions and parameters of the operation.
Figure 3:
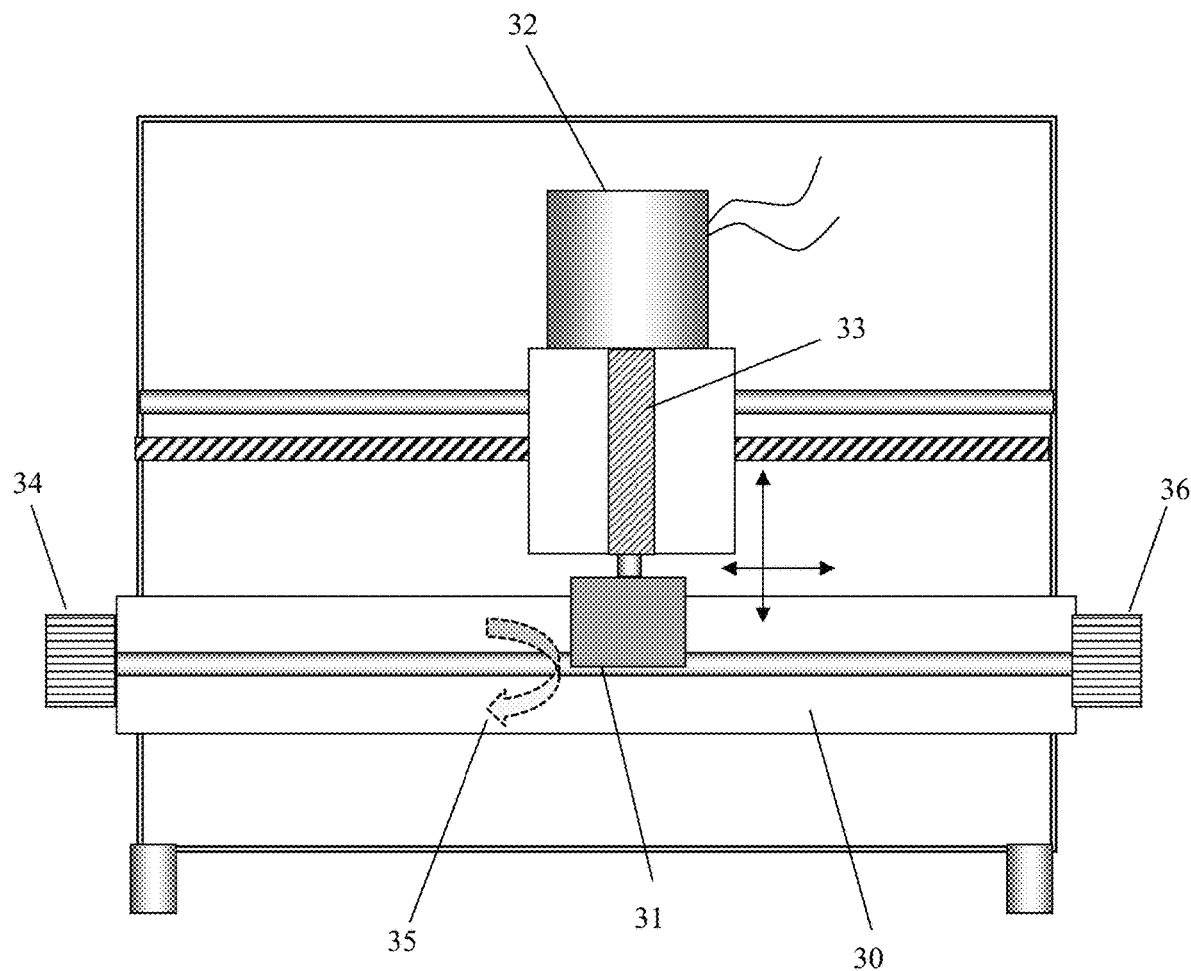
FIG. 3 depicts prior art: front view of a single carriage/single-probe slide screw tuner.
Figure 4:
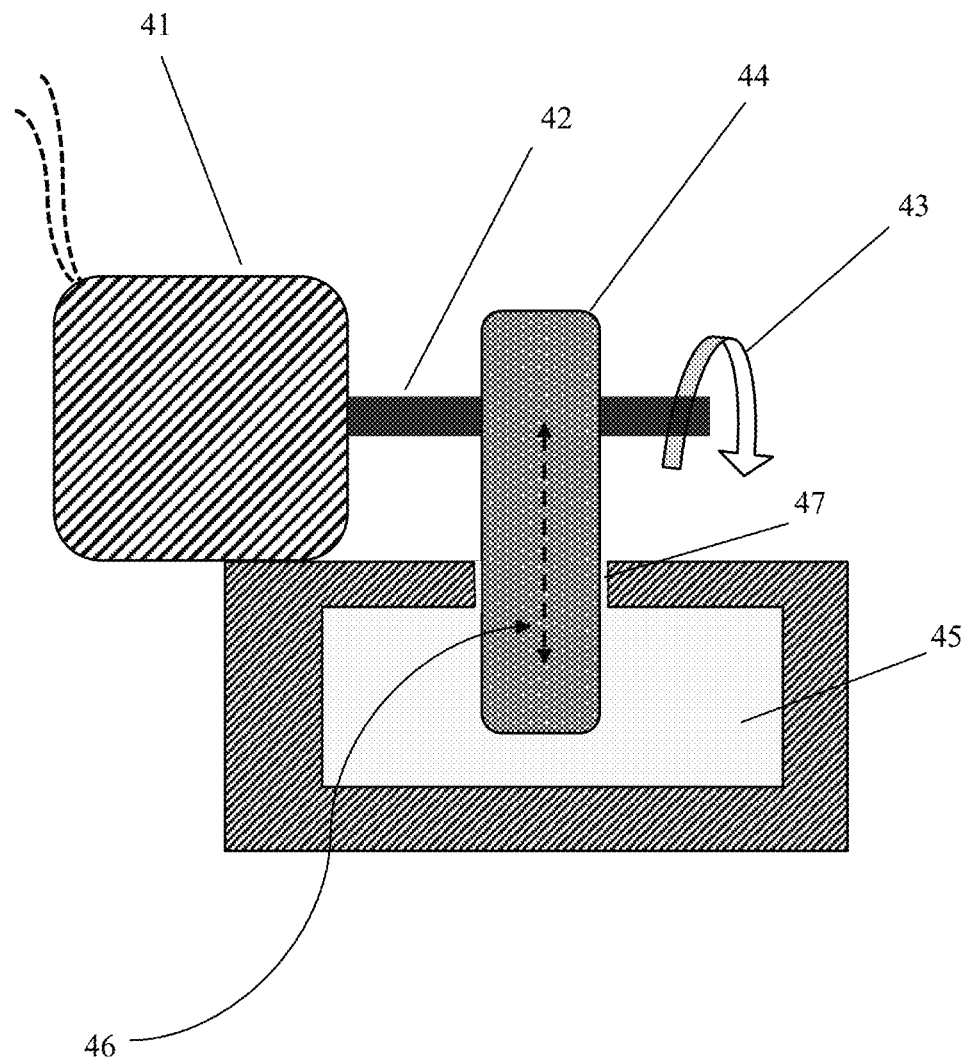
FIG. 4 depicts cross section of remotely controlled adjustable attenuator using a absorbing sliver insertable into the waveguide.
Figure 5:
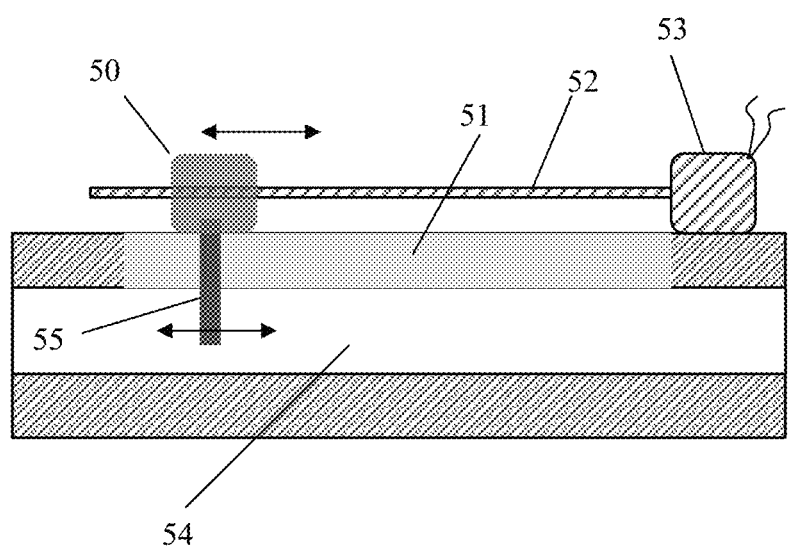
FIG. 5 depicts cross section of a fixed penetration reflective probe and remote control thereof.

This invention discloses a radio frequency (RF, microwave), computer-controlled impedance tuning system, suitable for load pull measurements, comprising at least one electro-mechanical impedance tuner and the calibration method thereof. The tuner (FIGS. 4, 5 and 9) uses a low loss waveguide transmission airline 904, which includes at least one slot 93, 96 placed centered 47 on a broad wall of the waveguide and allowing the absorbing attenuation sliver 44, 92 and the reflective tuning probe 95, 55 to either penetrate gradually or travel along the waveguide to control amplitude and phase of the reflection factor. The overall tuner can be seen in FIG. 10.

The horizontal control of the fixed penetration probe 55 in the airline 54 is best accomplished using linear electric actuators (see ref. 8) or a remotely controlled fixed motor 53 and an ACME screw 52 moving the mobile carriage 50 along the waveguide 54 traversing the slot 51. This movement control of the tuning probe 55 is much simpler than a cumbersome vertical axis and offers significantly lower overall tuner profile. The cross section of this segment is shown in FIG. 9C and the horizontal movement towards 902 and away 903 from the test port.

The attenuation control (FIG. 4) uses eccentric rotation control 43 of the absorbing sliver 44 and gradual insertion 46 into the waveguide cavity 45, by a second remotely controlled stepper motor 41. This is done either by directly attaching the sliver disc 44 to the motor axis 42 or, if needed, using some reduction gear. The motor 41 is also fixed at a position of the waveguide between the test port 91 and the tuning probe 95.

Figure 6A:
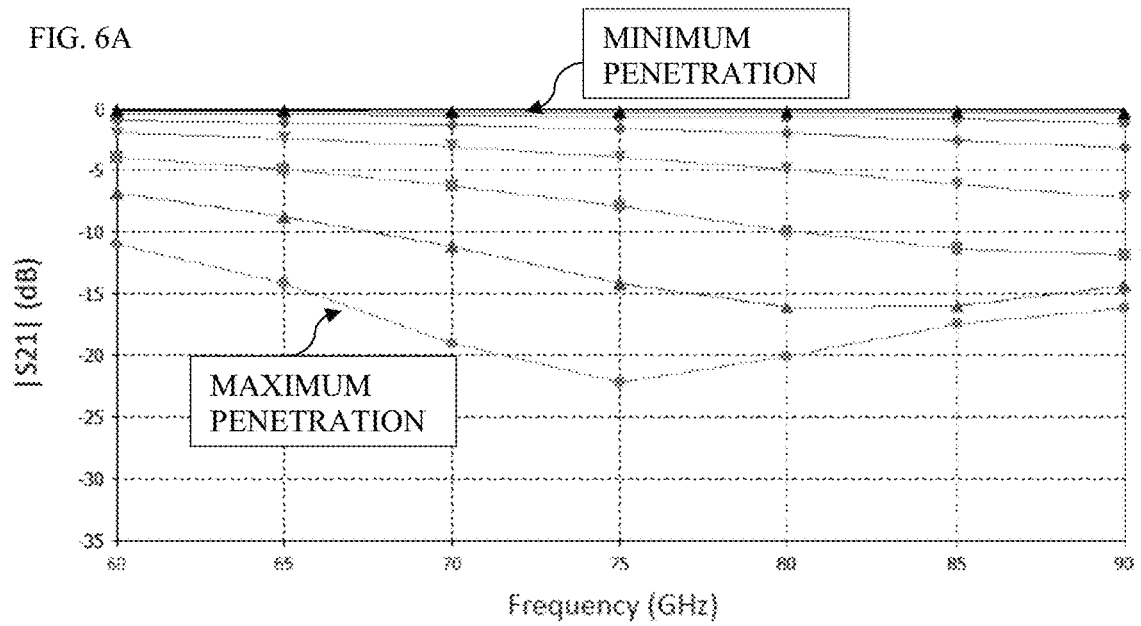
FIGS. 6A through 6B depict the transmission and reflection of the adjustable attenuation of the gradually insertable absorbing sliver over a WR-12 (60-90 GHz) frequency band.
Figure 6B:
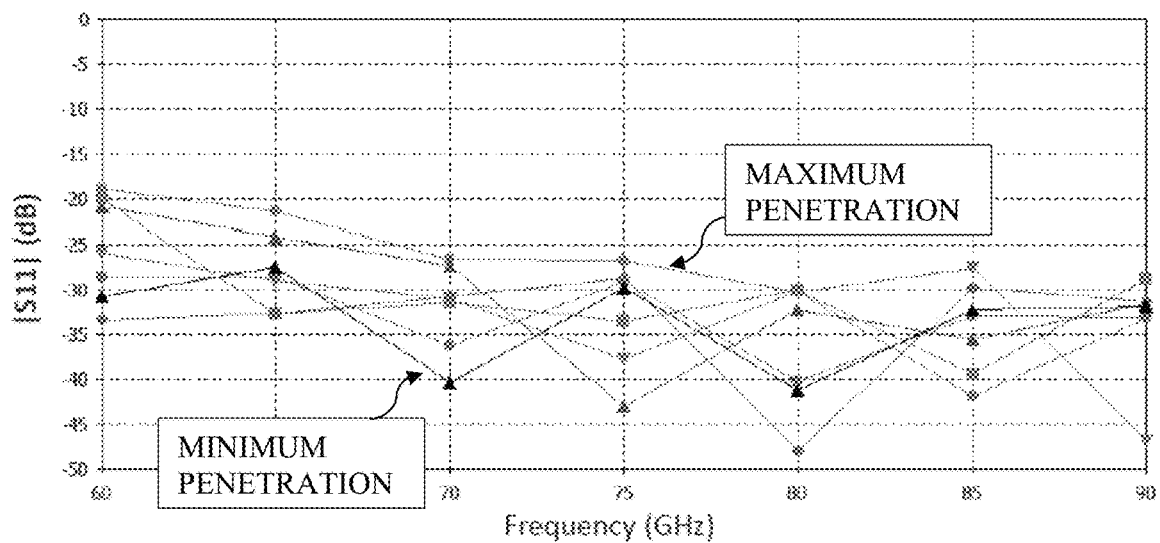

The operation of the load pull tuner is visualized in FIG. 9A: the RF energy is generated by the DUT and is injected into the waveguide 904 at the test port 91. Some 97 of this energy is reflected at the absorbing sliver 92, as seen in FIG. 6B, and returned back to the DUT; this is a spurious effect, that must, though, be accounted for. Most of the arriving energy is absorbed by the sliver 92, as is obvious when calculating the inverse available loss $|S21|^2/(1-|S11|^2)$ from FIGS. 6A and 6B, and the remaining part 98 traverses towards the reflective probe 95, which is held dielectrically 94 by a vertical control mechanism (axis) and is reflected back 901; the absorption by the sliver 92 and the reflection at the probe 95 determine the overall reflection factor 90 at the test port 91. Because the RF energy bounces back and forth between sliver 92 and probe 95, an exact calculation is complex. Therefore, the tuner is calibrated at every frequency for a combined multitude of horizontal tuning probe positions and sliver penetrations and the data are saved in a calibration file, retrieved and interpolated before use.

Figure 7:
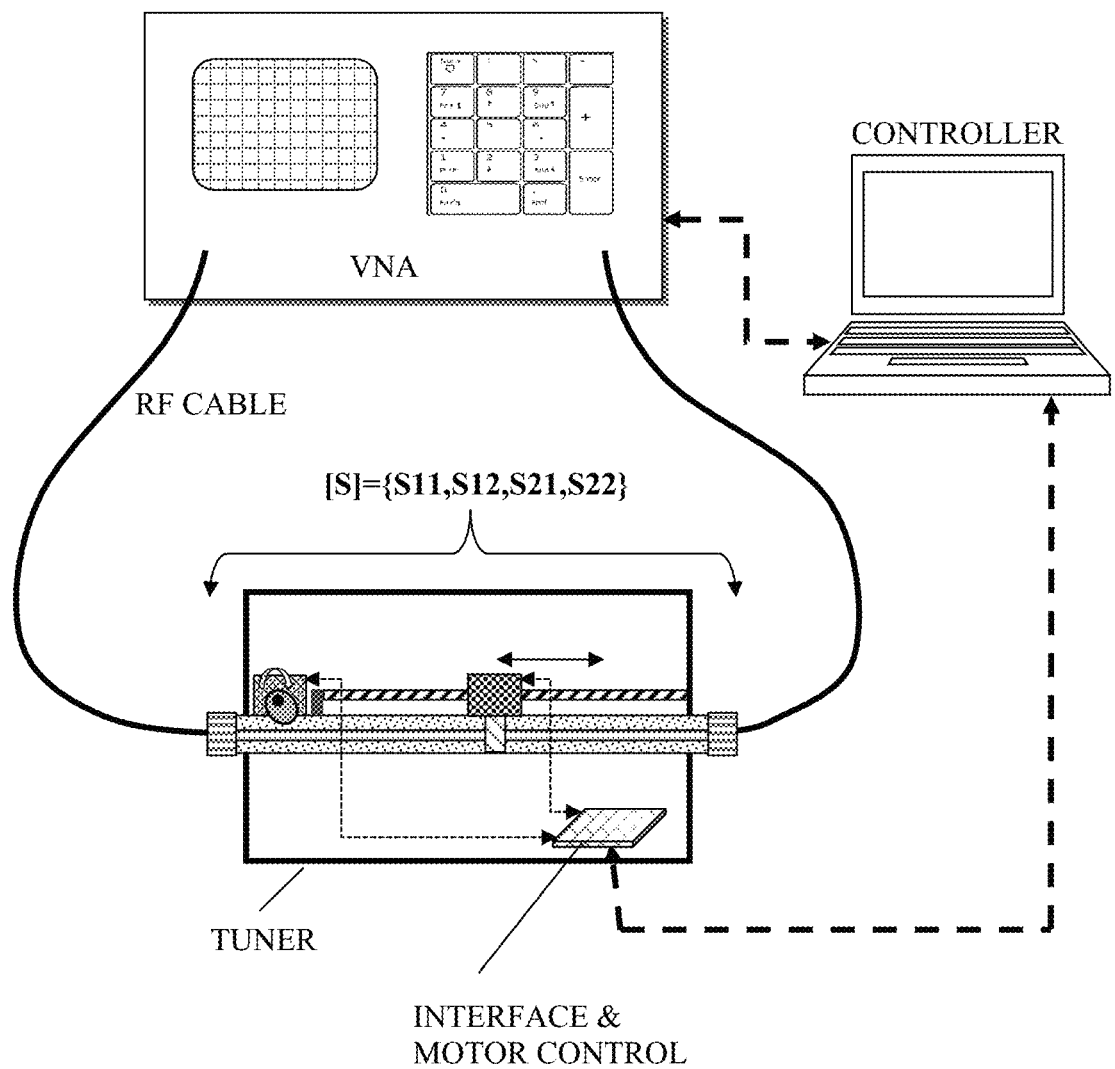
FIG. 7 depicts a calibration setup of the tuner.
Figure 8:
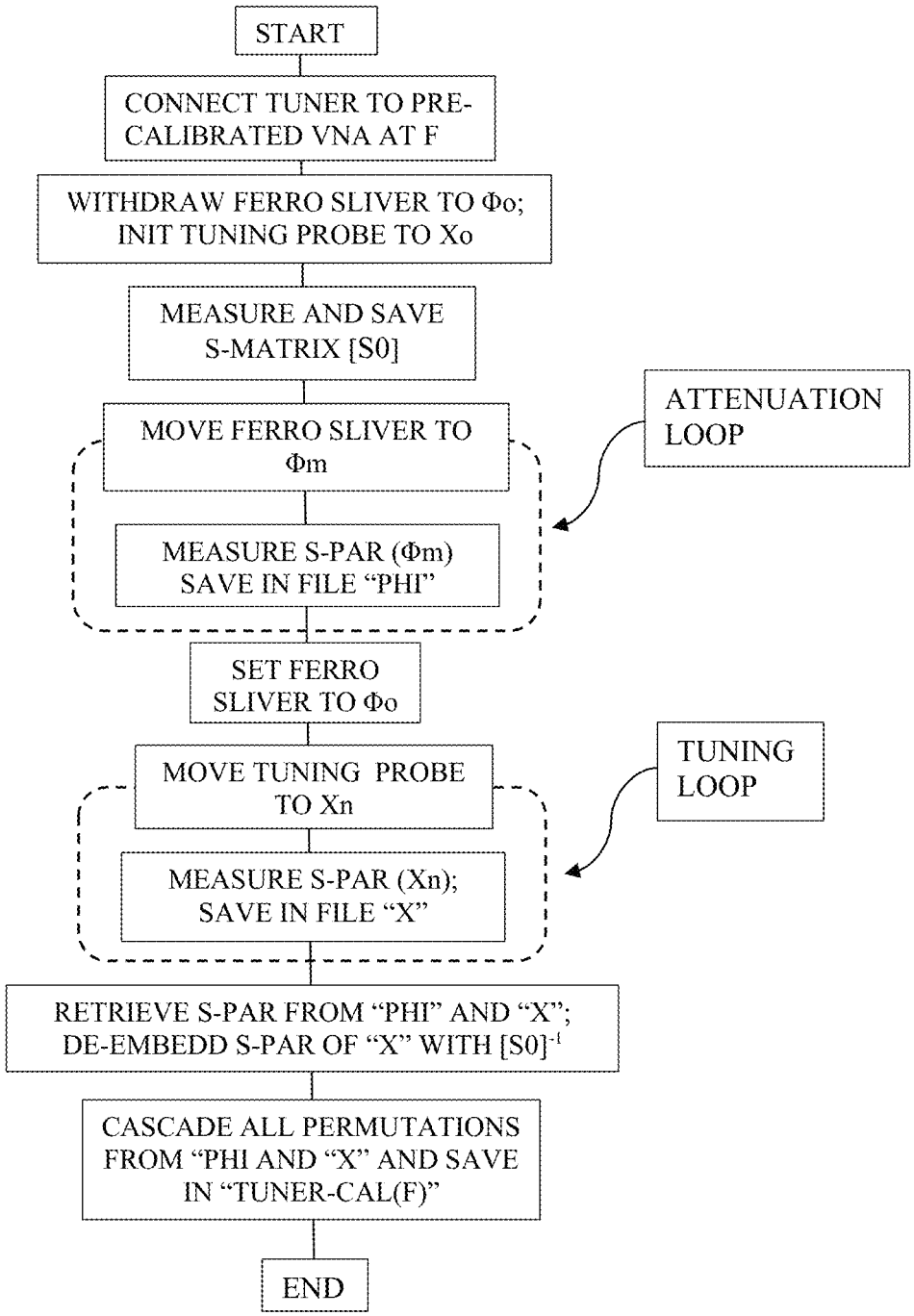
FIG. 8 depicts a flowchart of the de-embedding calibration algorithm of the fixed penetration tuning probe tuner with adjustable attenuator.

The tuner calibration flow chart is shown in FIG. 8: in a first step, after the tuner is connected to a pre-calibrated vector network analyzer (FIG. 7, see ref. 11), the absorbing sliver 92 is fully withdrawn from the waveguide allowing full energy transfer and the tuning probe 95 is placed at an initial position, that can be defined using a limit switch; this is called the INIT position and defines $\Phi-\Phi_0=0$ and X=0; after that the scattering (s−) parameters of the tuner are measured and saved in an init matrix [S0]; after that the calibration enters two move-measure-save loops. In the first loop the tuning probe 95 stays at X=0 and the sliver 92 is rotated gradually into the waveguide slot 93; The registering can be in degrees and mm, but it is more convenient to stick with motor steps: depending on motor step resolution and possible reduction gear a 0 to 90 or 0 to 180 degree rotation corresponds to at least 50 or 100 motor steps or 90/50 or 1.8 degree per motor step, which translates to a relative penetration of $h=H*\sin \Phi=\sin(\pi/4*Y)$ and $dH/H=\cos(\pi/4*Y)$ and X=0 to XMAX=$(\lambda/2)$/resolution, where H is the internal height of the waveguide and resolution is the displacement per motor step, all expressed in motor steps X or Y. Once the "sliver rotation, s-parameter measurement and saving in a file named PHI" is finished, the sliver is rotated back to the initial state $\Phi_0$ and a second move-measure-save cycle is started with the probe moving for X between 0 and 22; all the measured s-parameter data as a function of position X are cascaded (see ref. 10) with the invers matrix $[S0]^{-1}$ and saved in a file named X. Subsequently all s-parameter permutations of the data saved in files PHI and X are created in computer memory and saved in a tuner calibration file CAL(F) at the calibration frequency F; this file contains s-parameters of the tuner for a multitude of stepper motor combinations creating reflection factors covering the Smith chart. Using these anchor points proper interpolation functions allow high resolution tuning at combinations of horizontal probe positions and sliver penetrations between calibrated points. As an example: 20 penetration levels and 100 horizontal positions lead to 2000 calibration points; instead, the fine penetration resolution can be set to up to 200 levels and the horizontal movement up to 2000 steps, a total addressable space of 400,000 distinct reflection factors. The proposed calibration, instead requires a total of 100+20=120 points to be measured, lasting ca 2-4 minutes instead of a full calibration lasting 110 to 220 hours.

Figure 10:
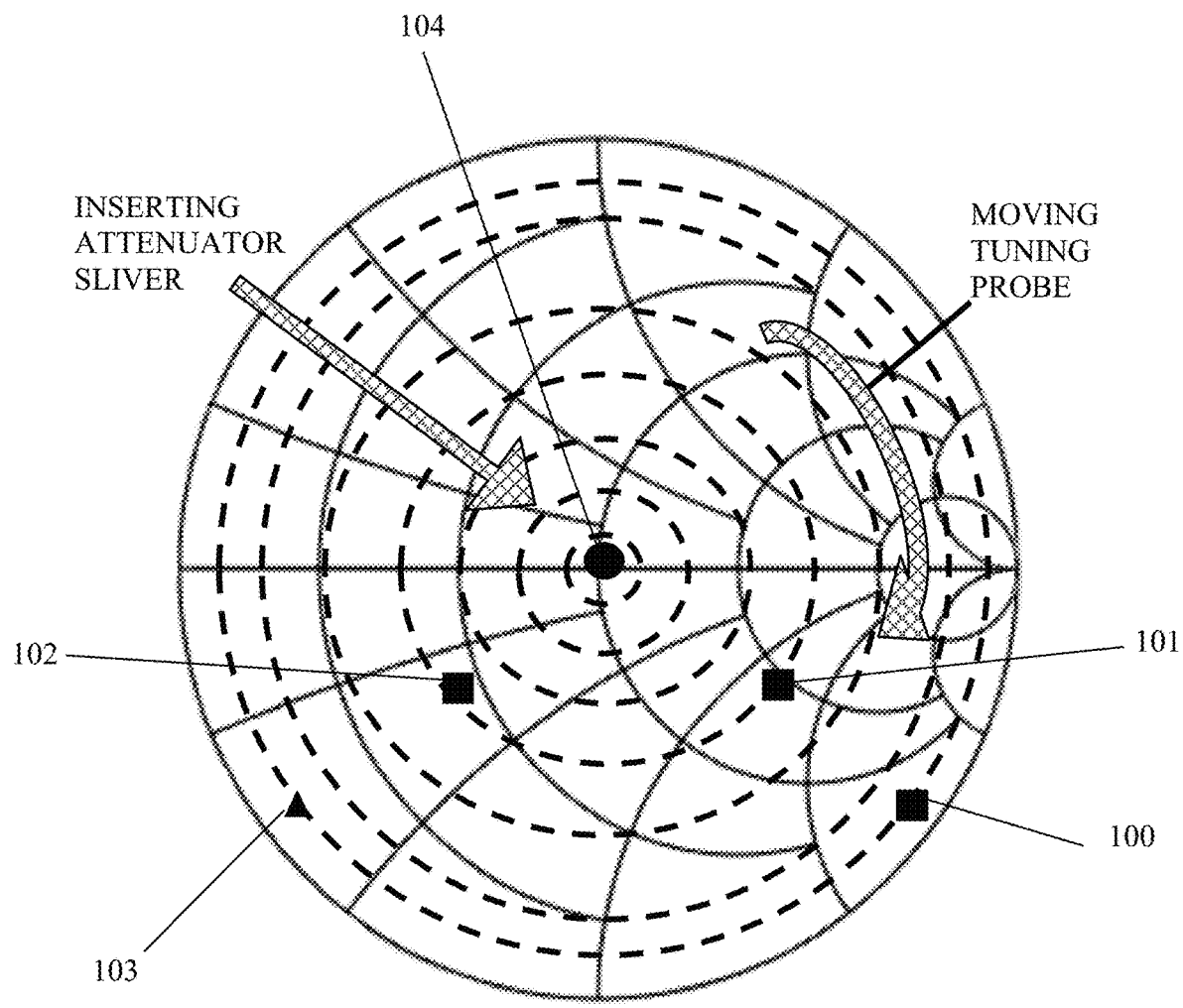
FIG. 10 depicts the reflection factor control and trajectories of impedance synthesis on the Smith chart.

The tuning mechanism is best explained using the diagram of FIG. 10: with the absorbing sliver withdrawn and the tuning probe at any arbitrary position X, the assumed reflection factor would be at point 100. The target being point 102, the control will follow either path 101-102 (i.e., increase attenuation and move the tuning probe) or path 103-102, i.e., move the probe first and then increase the attenuation. In both cases there is a single possible attenuation and horizontal robe setting, the choice is only the path to follow. Under circumstances, when the DUT is prone to spurious self-oscillations, the attenuation is set to maximum i.e. the starting point is always at 104 and the recommended move would follow a path moving X around the center 104 (which is invisible, since the vector has zero amplitude) and then reduce the attenuation to get to 102; this also reduces the risk of transient spurious oscillations during the movement of the tuning probe (see ref. 7).

Obvious alternatives to the disclosed concept of a load pull system using a tuner with one horizontally only moving probe and a pre-positioned adjustable attenuator and the associated calibration method shall not impede on to the validity of the present invention.

What is claimed is:

1. A load pull tuner system comprising:
   A waveguide load pull tuner comprising:
      a waveguide transmission line having two broad walls and two narrow walls, a test and an idle port, at least one slot centered along a broad wall, and
      a remotely controlled mobile carriage travelling along the waveguide and holding a reflective tuning probe which is inserted into the at least one slot at a fixed penetration,
      and
         a RF energy-absorbing sliver, remotely insertable at adjustable penetration into the at least one slot;
      wherein
         the RF energy-absorbing sliver is placed at a fixed position along the waveguide between the test port and the reflective tuning probe;
   and a waveguide load pull tuner calibration method comprising:
      connecting the tuner to a pre-calibrated vector network analyzer,
      measuring s-parameters of the tuner at a multitude of penetrations of the RF energy-absorbing sliver and positions of the reflective tuning probe along the waveguide and saving in a calibration file for later use.

2. The load pull tuner system of claim 1,
wherein the tuning probe of the waveguide load pull tuner is inserted into a first slot, which is at least one half of a wavelength long at a lowest frequency of operation of the waveguide load pull tuner, and the RF energy-absorbing sliver is inserted into a second slot, which is placed between the test port and the first slot.

3. The load pull tuner system of claim 1,
wherein the RF energy-absorbing sliver and the tuning probe of the waveguide load pull tuner are cascaded and inserted into the same slot,
and wherein the RF energy-absorbing sliver is inserted between the test port and the reflective tuning probe.

4. The load pull tuner system of claim 1,
wherein the RF energy-absorbing sliver of the waveguide load pull tuner is an oval disc rotating eccentrically around an axis perpendicular to the slot and inserted gradually into the slot between full extraction and maximum penetration.

5. The load pull tuner system of claim 4,
wherein the axis controlling the RF energy-absorbing sliver of the waveguide load pull tuner is remotely controlled by a second stepper motor and gear.

6. The load pull tuner system of claim 1,
wherein the mobile carriage of the waveguide load pull tuner is remotely controlled by a first stepper motor and gear.

7. A calibration method for load pull tuner system as in claim 1,
wherein the waveguide load pull tuner is connected with a pre-calibrated vector network analyzer, comprising the following steps:
   a) the RF energy-absorbing sliver is withdrawn out of the waveguide, defining a rotation angle $\Phi o=0$;
   b) the reflective tuning probe is moved close to the test port, defining a horizontal position $Xo=0$;
   c) s-parameters of the waveguide load pull tuner are measured and saved in an init matrix [S0];
   d) s-parameters of the waveguide load pull tuner are measured for a multitude of rotation angles $\Phi m$ of the RF energy-absorbing sliver between a minimum value $\Phi min$, corresponding to withdrawal, and a maximum value $\Phi max$ corresponding to maximum insertion and saved;
   e) the RF energy absorbing sliver is withdrawn back to angle $\Phi o=0$;
   f) s-parameters are measured for a multitude of positions $Xn$ of the reflective tuning probe and saved;
   g) the invers init matrix $[S0]^{-1}$ is cascaded with the s-parameters of step f) and saved;
   h) all permutations of s-parameters of steps d) and g) are cascaded and saved in a tuner calibration file comprising tuner s-parameters $Sij$ ($\Phi m$, $Xn$) for $\{i,j\}=\{1,2\}$.

* * * * *